(12) United States Patent
Morgan et al.

(10) Patent No.: US 10,309,999 B2
(45) Date of Patent: Jun. 4, 2019

(54) COMPACT TEST RANGE SYSTEM WITH ADJUSTABLE FEED HORN LOCATIONS

(71) Applicant: The Boeing Company, Chicago, IL (US)

(72) Inventors: Douglas P. Morgan, Ocean Shores, WA (US); Baird E. Perry, Port Orchard, WA (US); Sean Michael Raffetto, Seattle, WA (US)

(73) Assignee: The Boeing Company, Chicago, IL (US)

( * ) Notice: Subject to any disclaimer, the term of this patent is extended or adjusted under 35 U.S.C. 154(b) by 29 days.

(21) Appl. No.: 15/726,884

(22) Filed: Oct. 6, 2017

(65) Prior Publication Data

US 2019/0107567 A1    Apr. 11, 2019

(51) Int. Cl.
*G01R 29/10* (2006.01)
*H01Q 13/02* (2006.01)

(52) U.S. Cl.
CPC ............ *G01R 29/10* (2013.01); *H01Q 13/02* (2013.01)

(58) Field of Classification Search
CPC ............................... H01Q 13/01; G01R 29/10
See application file for complete search history.

*Primary Examiner* — Graham P Smith
(74) *Attorney, Agent, or Firm* — Vivacqua Law

(57) ABSTRACT

A compact test range system for testing an article located within a test zone comprises a reflector defining a surface and a focus, a feed horn configured to emit radio waves, one or more processors, and a memory coupled to the processor. The radio wave includes an infinite number of rays, where the rays of the radio wave include an uppermost ray, a middle ray, and a lowermost ray directed towards the surface of the reflector. The memory stores data comprising a database and program code that, when executed by processors, causes the compact range test system to receive as input a plurality of field tilt angles. In response to receiving the field tilt angles, the system determines three points of intersection between the uppermost radio wave, the middle radio wave, and the lowermost radio wave that correspond to a first test position.

20 Claims, 5 Drawing Sheets

COMPACT TEST RANGE SYSTEM WITH ADJUSTABLE FEED HORN LOCATIONS

FIELD

The disclosed system and method relate to a compact test range system and, more particularly, to a compact test range system including a reflector and a feed horn, where a position of the feed horn is offset from a focus of the reflector in a vertical and a horizontal direction in a test position that corresponds to a unique field angle.

BACKGROUND

Various techniques currently exist for testing antennas or determining a radar cross section (RCS) of an object such as, for example, a small-scale aircraft. Far-field range testing involves placing a test article at a relatively long distance away from instrumentation. Since far-field range testing requires a large amount of space due to the long distances between the test article and the instrumentation, outdoor facilities are typically used. Compact ranges are an alternative to traditional far-field ranges. Any test that is capable of being accomplished on a far-field range may also be done using a compact test range. A compact range allows an operator to test indoors, thereby avoiding issues such as unfavorable weather conditions that are often encountered when testing outdoors.

In compact range testing, a horn antenna conveys radio waves towards a parabolic reflector. The horn antenna is often referred to as a feed horn. The feed horn is placed at the focus of the parabolic reflector. The reflector may be a portion of the parabola that is offset from the axis of the parabolic reflector. A radio wave originating at the feed horn may include an infinite number of rays that are reflected off of a surface of the reflector. The rays of the radio wave are reflected from the surface of the reflector are then directed towards the test article. The rays of the radio wave are reflected off of the surface of the reflector are each parallel to one another, and are aligned with a horizontal axis. Moreover, the rays of the radio wave define a path from the feed horn to the axis of the paraboloid, where each path of each ray is equal in length to the other remaining rays of the radio wave. Since the rays of the radio wave are horizontal, parallel, and equal in length with respect to one another, a flat phase front is created within the testing zone. The flat phase front is representative of far-field conditions. Therefore, although the testing zone is positioned at a near-field distance from the reflector, the compact range testing arrangement is capable of producing the flat phase front created in far-field testing.

Although compact range testing provides numerous advantages and benefits, there are still challenges that exist. Specifically, the test article is rotated during compact range testing to create a matrix of measurements. However, the test article needs to be re-positioned each time a measurement is collected. Therefore, compact range testing may be cumbersome and may also take a relatively long time to complete.

SUMMARY

In one example, a compact test range system for testing an article located within a test zone is disclosed. The system comprises a reflector defining a surface and a focus, a feed horn configured to emit a radio wave, one or more processors, and a memory coupled to the processor. The radio wave includes an infinite number of rays, where the rays of the radio wave include an uppermost ray, a middle ray, and a lowermost ray directed towards the surface of the reflector. The memory stores data comprising a database and program code that, when executed by processors, causes the compact range test system to receive as input a plurality of field tilt angles. In response to receiving the plurality of field tilt angles, the system determines three points of intersection between the uppermost ray, the middle ray, and the lowermost ray at a first field tilt angle, where the three points of intersection define a triangle. The system is also caused to determine a centroid of the triangle, and set the centroid of the triangle as a first test position of the feed horn. The first test position is offset in an x-direction and a y-direction from the focus of the reflector, and the first field tilt angle corresponds to the first test position.

In another example, a method for testing an article within a test zone by a compact test range system is disclosed. The method includes receiving, by a computer, a plurality of field tilt angles. The computer is in communication with a feed horn. The method further includes emitting, by the feed horn, radio waves. The radio wave includes an infinite number of rays, where the rays of the radio wave include an uppermost ray, a middle ray, and a lowermost ray directed towards the surface of the reflector. In response to receiving the plurality of field tilt angles, the method includes determining three points of intersection between the uppermost ray, the middle ray, and the lowermost ray at a first field tilt angle by the computer. The three points of intersection define a triangle. The method also includes determining, by the computer, a centroid of the triangle. Finally, the method includes setting the centroid of the triangle as a first test position of the feed horn. The first test position is offset in an x-direction and a y-direction from a focus of the reflector, and the first field tilt angle corresponds to the first test position.

Other objects and advantages of the disclosed method and system will be apparent from the following description, the accompanying drawings and the appended claims.

DETAILED DESCRIPTION

Figure 1:
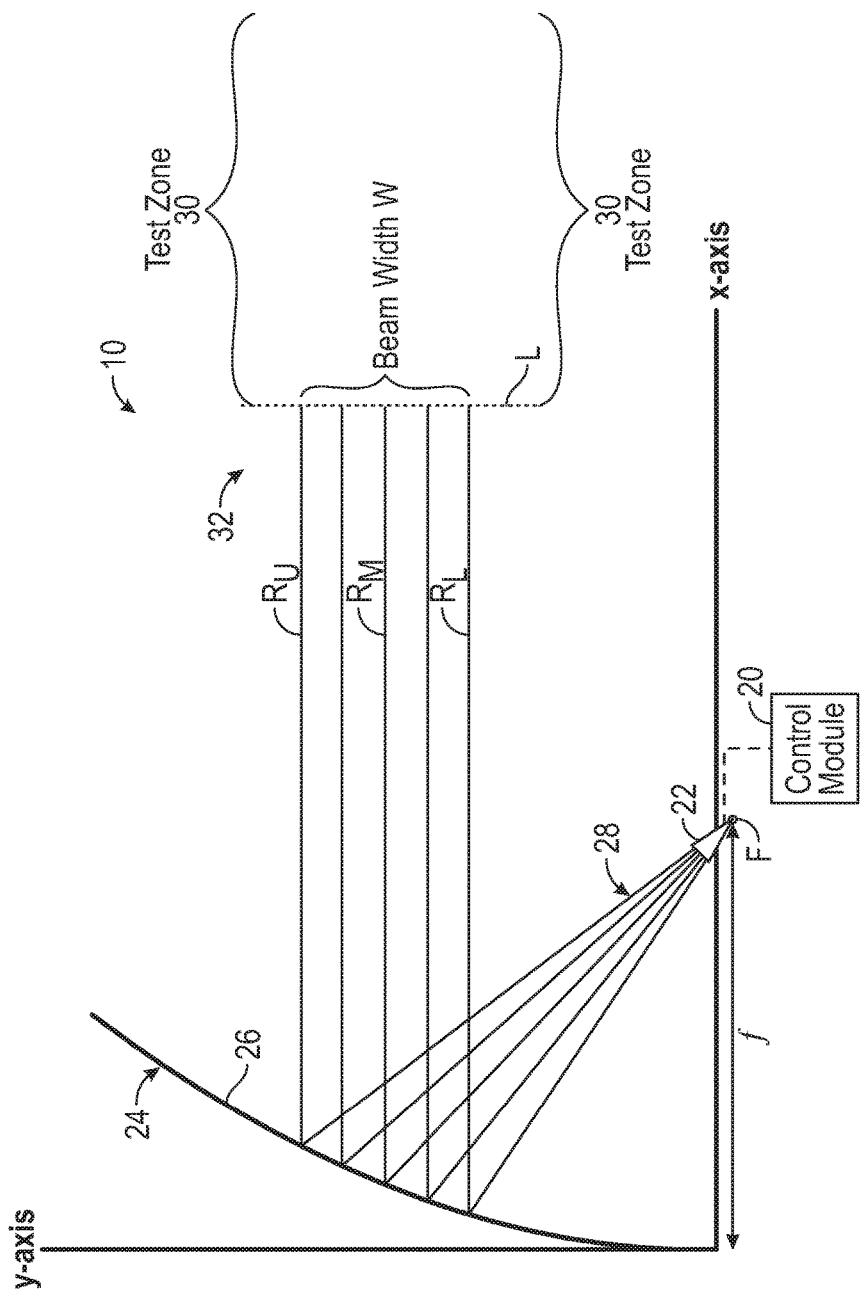
FIG. 1 is an exemplary schematic diagram illustrating a side view of the disclosed system that includes a reflector and a feed horn, where the feed horn is located at a focus of the reflector and emits a radio wave including an infinite number of rays.

FIG. 1 is an exemplary schematic diagram illustrating a compact range testing system 10. The system 10 is used to measure a test article (not illustrated in FIG. 1). In one embodiment, the test article is an antenna. However, the test article is not limited to an antenna. Instead, the disclosed system 10 may be used to determine a radar cross section (RCS) of another object such as, for example, a conductive sphere or small-scale aircraft. The system 10 includes a control module 20, a horn antenna or feed horn 22 and a reflector 24. The reflector 24 may also be referred to as a main reflector. The feed horn 22 is configured to emit radio waves 28 towards a surface 26 defined by the main reflector 24. As seen in FIG. 1, the radio wave 28 is illustrated as a plurality of rays. The surface 26 of the main reflector 24 is configured to reflect the rays of the radio wave 28 towards a test zone 30. The test zone 30 contains the test article.

The radio wave 28 includes an infinite number of rays. However, FIG. 1 illustrates the radio wave 28 including only five rays for purposes of clarity and simplicity. The rays of the radio wave 28 are reflected off of the surface 26 of the main reflector 24. The rays of the radio wave 28 are substantially parallel and are spaced at equal horizontal distances with respect to one another in order to create a flat phase front 32 within the test zone 30. In the embodiment as shown in FIG. 1, an imaginary line L is drawn that is normal to the rays of the radio wave 28 and parallel with a vertical or x-axis of the system 10, and is located within the test zone 30. The feed horn 22 is positioned at a focus F of the main reflector 24. The flat phase front 32 includes rays of a uniform phase and of a uniform amplitude within the test zone 30. As explained in greater detail below, during testing the feed horn 22 is offset from the focus F of the main reflector 24 in both the x-axis as well as a vertical or y-axis direction of the system 10.

Figure 2B:
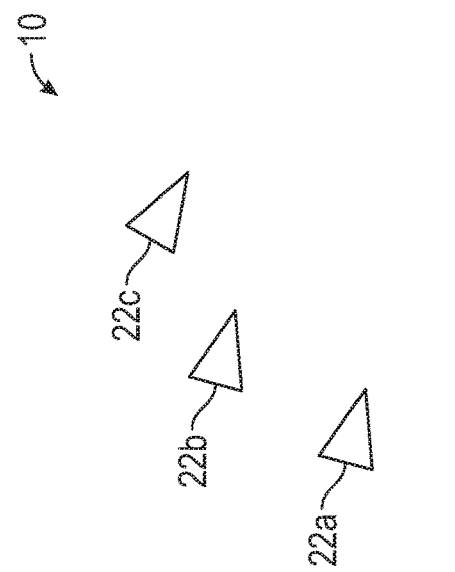
FIG. 2B is another embodiment of the system shown in FIG. 1, where multiple feed horns are provided and are activated one at a time.
Figure 2A:
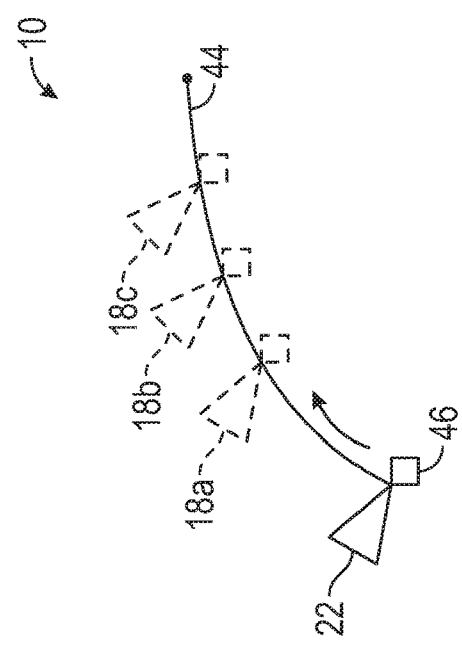
FIG. 2A is one embodiment of the system shown in FIG. 1, where the feed horn is steered from the focus of the reflector and into a plurality of positions along a feed path rail.
Figure 3:
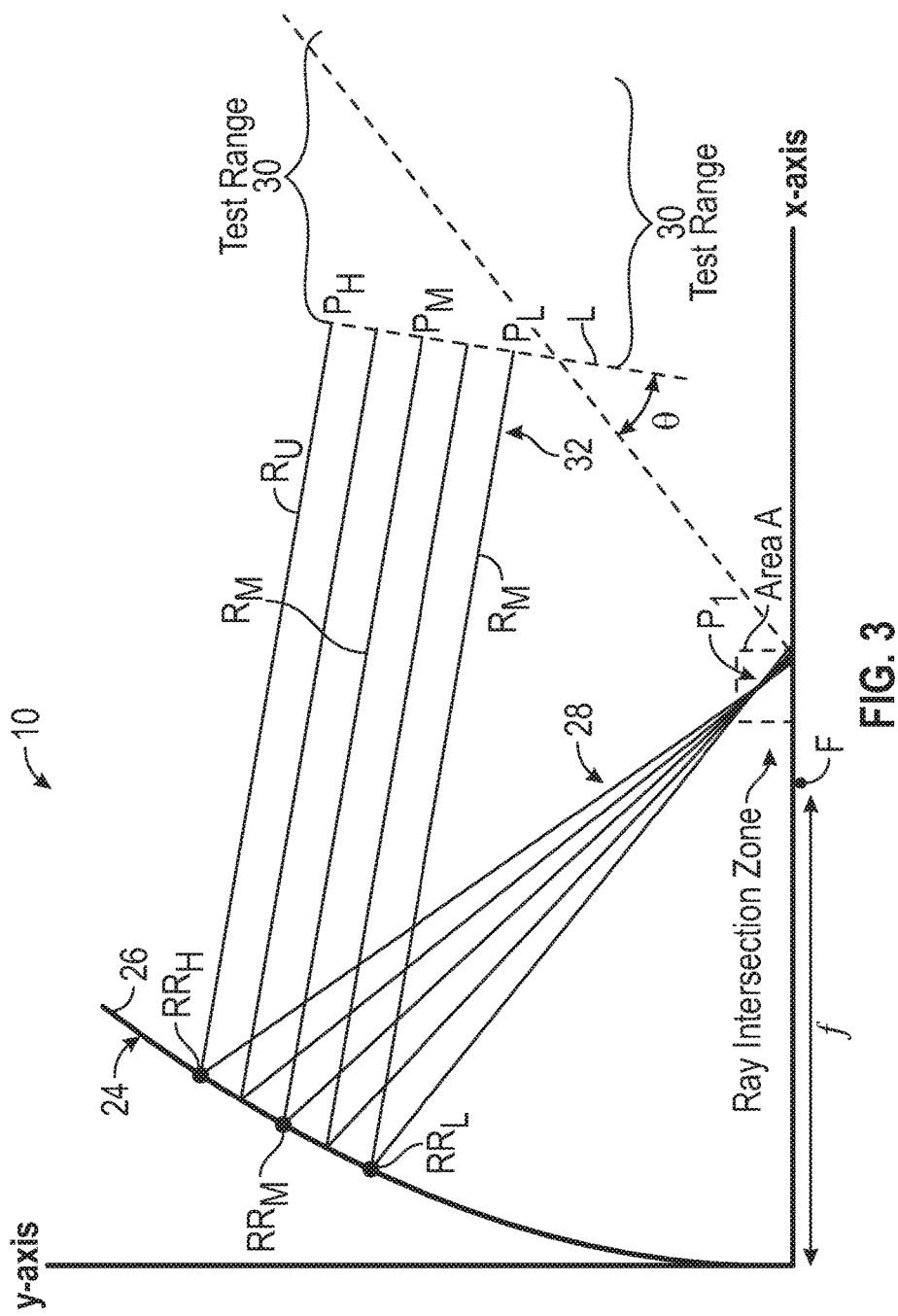
FIG. 3 is an schematic diagram illustrating the system shown in FIG. 1, where a location of the feed horn (not illustrated) is offset in both a vertical and a horizontal plane and an imaginary line is drawn at a field tilt angle.

FIGS. 2A and 2B illustrate two different approaches to offset the feed horn 22, and FIG. 3 illustrates the feed horn 22 offset in both the x-axis and y-axis direction. As seen in FIG. 3, the line L is now tilted at a field tilt angle θ. The field tilt angle θ is measured between the y-axis and the line L, where the line L is still normal with respect to the rays of the radio wave 28. As seen in FIG. 3, the flat phase front 32 is maintained even as the feed horn 22 is steered or offset from the focus F of the main reflector 24 in the x-axis and the y-axis directions. During testing, the feed horn 22 is positioned into a plurality of test positions, where each test position is offset from the focus F of the main reflector 24 along both the x-axis and the y-axis. Each test position of the feed horn 22 corresponds to a unique field tilt angle θ. The field tilt angles θ are based on the particular type of testing to be performed by the system 10. That is, a specific number of field tilt angles θ as well as values of the field tilt angles θ are based on the type of test performed by the system 10. For example, some types of testing may only require three or four different measurements in a limited range, while some other types of testing may require many measurements that are taken along a wide span.

FIG. 2A is one embodiment of the system 10 where the feed horn 22 is steered from the focus F into a plurality of positions 18a, 18b, 18c along a feed path rail 44 by an actuator 46. The positions of the feed horn 22 are shown in phantom line along the feed path rail 44. Although three positions are shown, the feed horn 22 may be positioned into any number of positions along the feed path rail 44. Indeed, only three positions are illustrated in FIG. 2A for purposes of simplicity and clarity.

FIG. 2B is an alternative embodiment of the system 10 where a plurality of feed horns 22a, 22b, 22c are provided and are each in communication with the control module 20 (FIG. 1). As explained below, the feed horns 22a, 22b, 22c are activated one at a time by the control module 20. Referring to FIGS. 1, 2A, and 2B, the control module 20 is in communication with either the actuator 46 shown in FIG. 2A or the multiple feed horns 22a, 22b, 22c shown in FIG. 2B.

Turning back to FIG. 1, the system 10 is illustrated as a prime-focus compact range testing system, and the feed horn 22 is a low gain feed horn. A low gain feed horn creates a broad beam width. Accordingly, the radio wave 28 emitted by the feed horn 22 includes a relatively broad beam width W. Specifically, the beam width W is defined by an uppermost ray $R_U$ and a lowermost ray $R_L$ defined by the radio wave 28. A middle ray $R_M$ is located between the uppermost ray $R_U$ and the lowermost ray $R_L$, where the middle ray $R_M$ is equidistant between the uppermost ray $R_U$ and the lowermost ray $R_L$. Although a low gain feed horn is described, in an alternative embodiment the feed horn 22 is a high gain feed horn that produces a narrower beam width. Moreover, although FIG. 1 only illustrates a single main reflector 24, in another embodiment a second, sub-reflector may be used as well. For example, a shaped-Cassegrain dual-reflector configuration would include a main reflector, a sub-reflector, and a high gain feed horn. Furthermore, although a prime-focus compact range is disclosed in the figures, the disclosure may apply to other compact range configurations as well such as, but not limited to, a Gregorian dual-reflector, the shaped-Cassegrain dual-reflector, and a dual singly-curved reflector configuration.

The main reflector 24 is shaped as a portion or a section of paraboloid of revolution. The paraboloid of revolution defines the focus F. Since the main reflector 24 is shaped as a section of a paraboloid of revolution, the radio waves 28 that emanate from the feed horn 22, which is located at the focus F, reflect off of the surface 26 of the reflector 24 as rays that are substantially parallel with respect to one another. Moreover, the rays of the radio wave 28 terminate at the line L and are all of equal length.

The testing of antennas and measurement of the RCS of an object requires that the antenna or object under test be illuminated by a uniform or flat phase front. During testing, a matrix of measurements representing a series of different positions of the test article is required. Conventional systems require that the test article be physically rotated in order to collect the required measurements. As explained in greater detail below, the disclosed feed horn 22 is offset from the focus F of the main reflector 24 in the x-axis and the y-axis direction during testing to collect the required measurements, and therefore the test article does not need to be physically rotated.

It is to be appreciated that if the main reflector 24 is only offset in vertical direction or the y-axis, then two issues occur. First, the rays of the radio wave 28 that reflect off of the surface 26 of the reflector 24 are not substantially parallel with respect to one another. Instead, the rays may diverge from one another. Moreover, the rays that reflect off of the surface 26 of the reflector 24 do not create a flat phrase front, thereby creating a less than ideal far-field condition.

FIG. 3 is an illustration of the system 10 in FIG. 1, where the feed horn 22 (not visible in FIG. 2) is offset in both the x-axis and the y-axis direction from the focal F of the main reflector 24, and the line L located within the test zone 30 is positioned at the field tilt angle θ. As seen in FIG. 3, the flat phase front 32 is maintained with respect to the field tilt angle θ. As explained below, the control module 20 determines the position of the feed horn 22 (FIG. 1) offset from the focus F in both the x-axis and the y-axis direction.

The control module 20 (FIG. 1) receives as input a plurality of field tilt angles θ. As mentioned above, the specific number of field tilt angles θ as well as values of the field tilt angles θ are based on the particular type of test performed by the system 10. In response to receiving the field tilt angles θ, the control module 20 determines a test position for each of the field tilt angles θ. Each test position represents a location of the feed horn 22 offset from the focus F of the main reflector 24 along both the x-axis and the y-axis. Accordingly, each test position of the feed horn 22 corresponds to a unique field tilt angle θ. The position of the feed horn 22 is changed by either steering the feed horn 22 along the feed path rail 44 (shown in FIG. 2A). In the embodiment as shown in FIG. 2B the feed horns 22a, 22b, 22c are activated one-by-one based on a raster scan.

Continuing to refer to FIG. 3, the control module 20 (FIG. 1) determines a first test position $P_1$ based on a first field tilt angle θ. It is to be appreciated that the approach described in FIGS. 3, 4, and 5 below is repeated for each field tilt angle θ. As seen in FIG. 3, the test zone 30 is defined by a top point $P_H$, a middle point $P_M$, and a lower point $P_L$, where the top point $P_H$ is representative of the uppermost ray $R_U$ of the radio wave 28 and the lower point $P_L$ is representative of the lowermost ray $R_L$ of the radio wave 28. The middle point $P_M$ is representative of a midpoint between the top point $P_H$ and the lower point $P_L$.

The points $P_H$, $P_M$, $P_L$ each lie along the line L. The control module 20 (FIG. 1) determines the line L based on Equation 1. The control module 20 also stores in memory Equation 2, which expresses the shape of the reflector's surface 26:

$$y - p_y = -\tan(\theta)(x - p_x) \quad (1)$$

$$y^2 = 4fx \quad (2)$$

where $p_x$ and $p_y$ represent the x and y coordinates of either the top point $P_H$, the middle point $P_M$, and the lower point $P_L$. For Equation 2, f is the focal point of a paraboloid that is rotated in order to create the paraboloid of revolution of the main reflector 24, and x and y represent the points on the x-axis and the y-axis.

FIG. 3 also illustrates ray reflection points $RR_H$, $RR_M$, and $RR_L$ are located along the surface 26 of the reflector 24. The ray reflection points $RR_H$, $RR_M$, and $RR_L$ each correspond to either the top point $P_H$, the middle point $P_M$, and the lower point $P_L$. The ray reflection points $RR_H$, $RR_M$, and $RR_L$ each represent either the uppermost ray $R_U$ reflecting off the surface 26, the middle ray $R_M$ reflecting off the surface 26, or the lowermost ray $R_L$ reflecting off the surface 26. The top reflection point $RR_H$, the middle reflection point $RR_M$, and the lower reflection point $RR_L$ are each expressed in x and y coordinates. Equation 3 expresses the x coordinate and Equation 4 expresses the y coordinate for the three reflection points $RR_H$, $RR_M$, $RR_L$:

$$r_y = \frac{2f}{\tan(\theta)}\left[\sqrt{\frac{p_x \tan^2(\theta) + p_y \tan(\theta) + f}{f}} - 1\right] \quad (3)$$

$$r_x = \frac{r_y^2}{4f}. \quad (4)$$

Equation 5 expresses a unit-normal vector $\hat{n}$ that is normal to the surface 26 of the main reflector 24 at one of the ray reflection points $RR_H$, $RR_M$, $RR_L$. Equation 6 expresses an incident ray unit-vector $\hat{i}$ at one of the ray reflection points $RR_H$, $RR_M$, $RR_L$:

$$\hat{n} = \frac{1}{\sqrt{4f^2 + r_y^2}}(2f\hat{x} - r_y\hat{y}) \quad (5)$$

$$\hat{i} = -\cos(\theta)\hat{x} + \sin(\theta)\hat{y} \quad (6)$$

Equation 7 expresses a reflected ray unit-vector $\hat{v}$ at one of the ray reflection points $RR_H$, $RR_M$, $RR_L$, which is found in terms of the unit-normal vector $\hat{n}$ and the incident ray unit-vector $\hat{i}$, where:

$$\hat{v} = \hat{i} - 2(\hat{i}\cdot\hat{n})\hat{n} = v_x\hat{x} + v_y\hat{y} \quad (7)$$

A line through one of the ray reflection points $RR_H$, $RR_M$, $RR_L$ and aligned with the reflected ray unit-vector $\hat{v}$ is expressed in Equation 8 as $$y - r_y = s(x - r_x) \quad (8)$$

Where: $s = \dfrac{v_y}{v_x}$

Equations 9 and 10 express an intersection point Q:

$$q_x = \frac{r_{y2} - r_{y1} + s_1 r_{x1} - s_2 r_{x2}}{s_1 - s_2} \quad (9)$$

$$q_y = \frac{s_1 r_{y2} - s_2 r_{y1} + s_1 s_2 (r_{x1} - r_{x2})}{s_1 - s_2} \quad (10)$$

where $q_x$ and $q_y$ represent the x and y coordinates of the intersection point Q. The intersection point Q represents either an intersection point $Q_{HM}$, an intersection point $Q_{HL}$, or an intersection point $Q_{ML}$, which are each illustrated in FIG. 4 and are described in greater detail below. The intersection points $Q_{HM}$, $Q_{HL}$, $Q_{ML}$ are used to determine the first test position $P_1$ of the feed horn 22 (FIG. 1).

Figure 4:
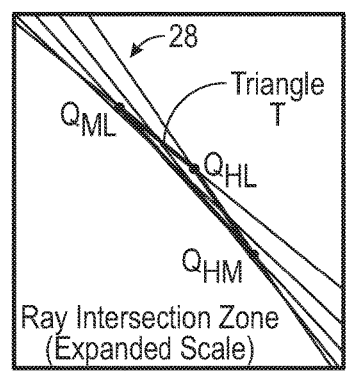
FIG. 4 is an enlarged view of Area A shown in FIG. 3, where a plurality of intersections between rays of the radio wave are illustrated.

Referring now to FIG. 4, an enlarged portion of Area A in FIG. 3 is illustrated. Area A represents an area where the various rays of the radio wave 28 intersect one another. Referring to FIGS. 3 and 4, the various rays intersect one another within a plane in order to create a triangular profile or triangle T. The control module 20 determines three points of intersection between the uppermost ray $R_U$, the middle ray $R_M$, and the lowermost ray $R_L$, where the three points of intersection define the triangle T. Specifically, the triangle T is defined by the intersection point $Q_{HM}$, the intersection point $Q_{HL}$, and the intersection point $Q_{ML}$. The intersection point $Q_{HM}$ represents an intersection between the uppermost ray $R_U$ and the middle ray $R_M$ of the radio wave 28. The intersection point $Q_{HL}$ represents an intersection point between the uppermost ray $R_U$ and the lowermost ray $R_L$ of the radio wave 28. The intersection point $Q_{ML}$ represents an intersection point between the middle ray $R_M$ and the uppermost ray $R_U$ of the radio wave 28.

Figure 5:
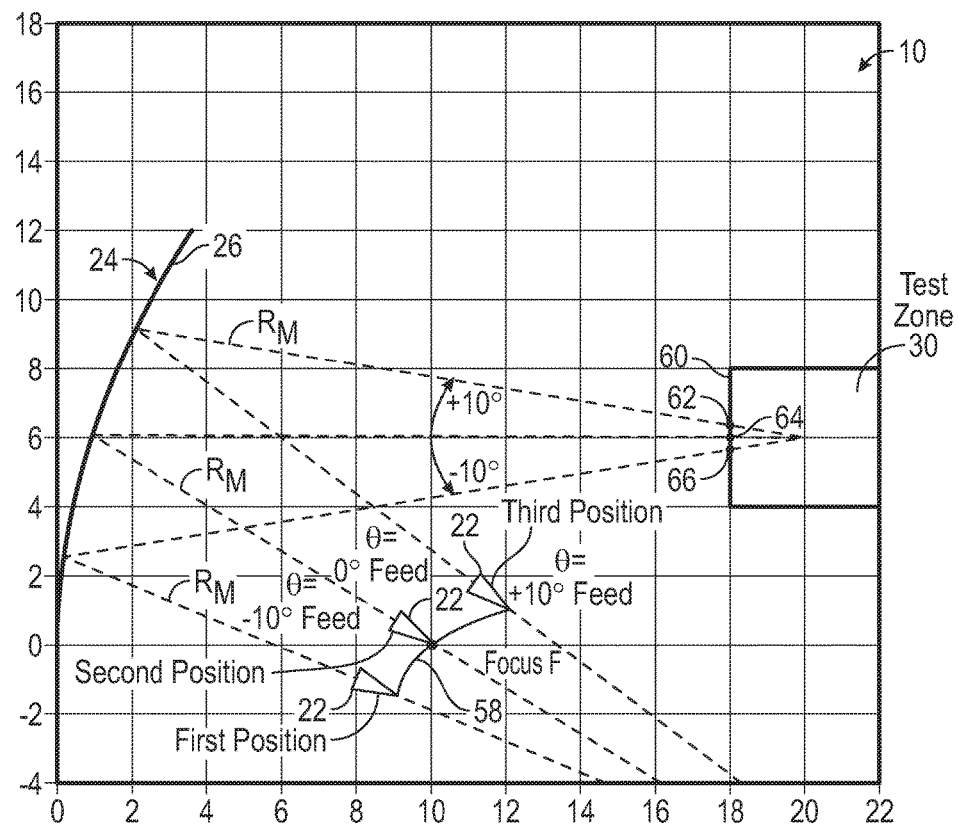
FIG. 5 is an exemplary schematic diagram of the feed horn located at three different positions, where each position is based on a unique field tilt angle.

The control module 20 (FIG. 1) then determines a centroid of the triangle T created by the intersecting rays. The centroid of the triangle T represents the first test position $P_1$ (FIG. 3). Once the control module 20 determines the first test position $P_1$, then the control module 20 determines another test position based on another field tilt angle θ. Turning now to FIG. 5, an exemplary schematic diagram illustrating three different test positions of the feed horn 22 along a feed path 58 is illustrated. A first position of the feed horn 22 is determined at a field tilt angle of about −10°, a second position of the feed horn 22 is determined at a field tilt angle of about 0°. The second position of the feed horn 22 is located at the focus F of the main reflector 24. The third position of the feed horn 22 is determined at a field tilt angle of about 10°. Thus, the pitch angle of the exemplary system shown in FIG. 5 is +/−10°.

FIG. 5 also illustrates only the middle ray $R_M$ generated by the feed horn 22 at each of the three test positions. Accordingly, a front face 60 of the test zone 30 experiences three unique data points 62, 64, 66 that are collected by the middle ray $R_M$ of the radio wave 28. Referring now to FIGS. 2A and 5, in one embodiment the feed horn 22 is actuated into one of the first position, the second position, or the third position by steering the feed horn 22 along the feed path rail 44 by the actuator 46. Referring now to FIGS. 2B and 5, in another embodiment the feed horns 22a, 22b, 22c are each positioned at a unique location, where each unique location is offset in both the x-direction and the y-direction from the focus F. The feed horns 22a, 22b, 22c are activated one by one or one at a time by the control module 20 (not shown in FIG. 2B). Specifically, the feed horns 22a, 22b, 22c are each activated for a very short amount of time such as, for example about 1 millisecond. In other words, each feed horn 22a, 22b, 22c are each activated one by one for a period of time. The period of time is short or brief enough such that activation of the plurality of feed horns 22a, 22b, 22c appears instantaneous to an ordinary observer.

If the test requires relatively few measurements, then the configuration as shown in FIG. 2B may be used. This is because a separate feed horn is required for each measurements. Thus, a test requiring hundreds of measurements would require just as many feed horns and would therefore be impractical. In one non-limiting example, if a test requires five or less measurements, then the configuration illustrated in FIG. 2B is used.

Referring generally to the figures, technical effects and benefits of the disclosed compact test range system include the ability to obtain multiple measurements of an antenna or another object without the need to physically rotate the test article. Instead, the feed horn is offset into one of a plurality of test positions, where each test position corresponds to a unique field tilt angle. The conventional approach to obtain multiple measurements during testing involves re-positioning the test article each time a measurement was collected. Thus, conventional compact range testing sometimes takes a relatively long time to complete. In contrast, the disclosed system allows for the test article to remain stationary, and instead controls the testing position of the feed horn. The disclosed approach may significantly reduce the amount of time required to perform certain types of testing. For example, one type of test that includes a relatively high data density may require about a week to test using the traditional approach of rotating the test object, but the disclosed compact range testing system only requires about a day of testing time.

Figure 6:
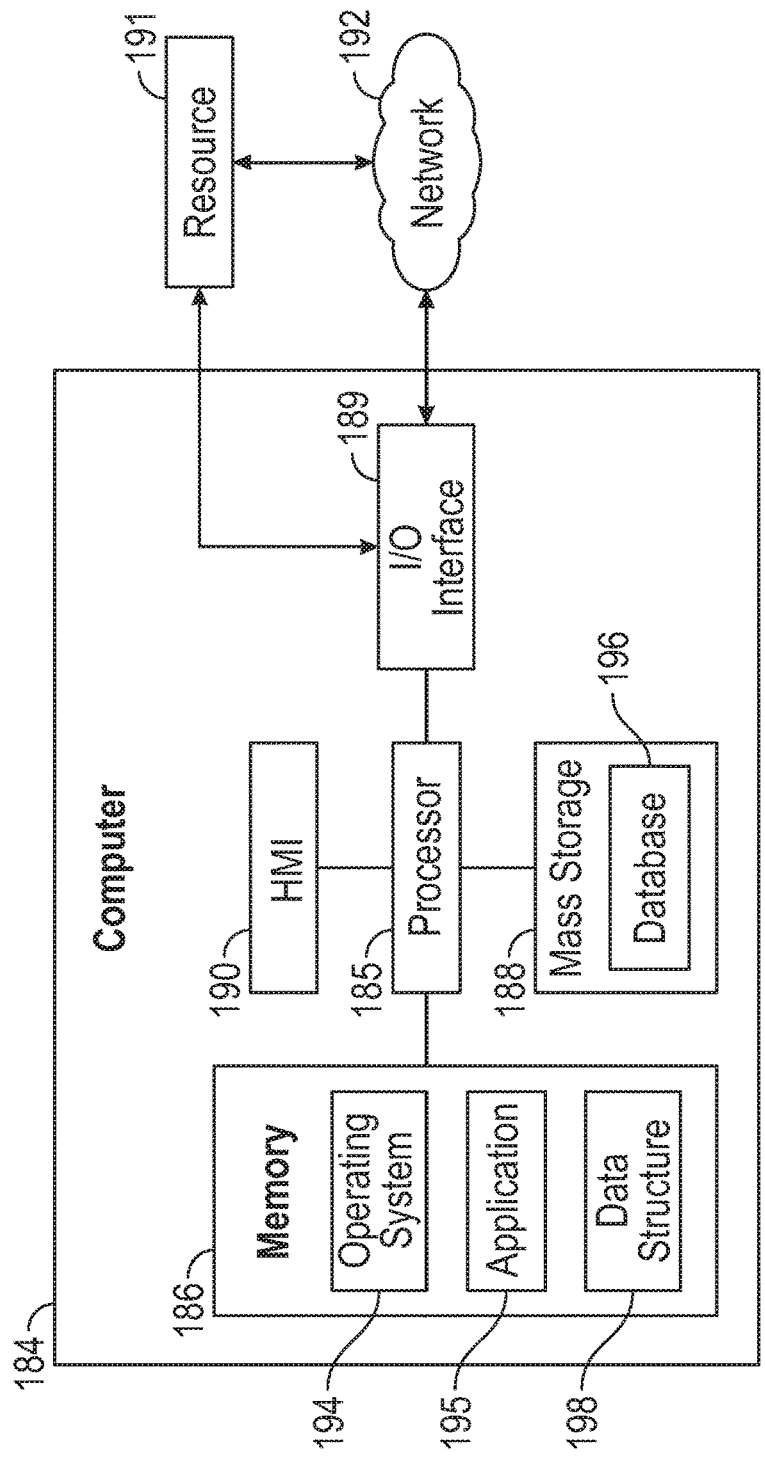
FIG. 6 is a diagram of a computer system used in the embodiments shown in FIGS. 1-5.

Referring now to FIG. 6, the control module 20 in FIG. 1 is implemented on one or more computer devices or systems, such as exemplary computer system 184. The computer system 184 includes a processor 185, a memory 186, a mass storage memory device 188, an input/output (I/O) interface 189, and a Human Machine Interface (HMI) 190. The computer system 184 is operatively coupled to one or more external resources 191 via a network 192 or I/O interface 189. External resources may include, but are not limited to, servers, databases, mass storage devices, peripheral devices, cloud-based network services, or any other suitable computer resource that may be used by the computer system 184.

The processor 185 includes one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 186. Memory 186 includes a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing information. The mass storage memory device 188 includes data storage devices such as a hard drive, optical drive, tape drive, volatile or non-volatile solid state device, or any other device capable of storing information.

The processor 185 operates under the control of an operating system 194 that resides in memory 186. The operating system 194 manages computer resources so that computer program code embodied as one or more computer software applications, such as an application 195 residing in memory 186, has instructions executed by the processor 185. In an alternative embodiment, the processor 185 executes the application 195 directly, in which case the operating system 194 may be omitted. One or more data structures 198 may also reside in memory 186, and may be used by the processor 185, operating system 194, or application 195 to store or manipulate data.

The I/O interface 189 provides a machine interface that operatively couples the processor 185 to other devices and systems, such as the network 192 or external resource 191. The application 195 thereby works cooperatively with the network 192 or external resource 191 by communicating via the I/O interface 189 to provide the various features, functions, applications, processes, or modules comprising embodiments of the invention. The application 195 has program code that is executed by one or more external resources 191, or otherwise rely on functions or signals provided by other system or network components external to the computer system 184. Indeed, given the nearly endless hardware and software configurations possible, persons having ordinary skill in the art will understand that embodiments of the invention may include applications that are located externally to the computer system 184, distributed among multiple computers or other external resources 191, or provided by computing resources (hardware and software) that are provided as a service over the network 192, such as a cloud computing service.

The HMI 190 is operatively coupled to the processor 185 of computer system 184 in a known manner to allow a user to interact directly with the computer system 184. The HMI 190 may include video or alphanumeric displays, a touch screen, a speaker, and any other suitable audio and visual indicators capable of providing data to the user. The HMI 190 may also include input devices and controls such as an alphanumeric keyboard, a pointing device, keypads, push-buttons, control knobs, microphones, etc., capable of accepting commands or input from the user and transmitting the entered input to the processor 185.

A database 196 resides on the mass storage memory device 188, and may be used to collect and organize data used by the various systems and modules described herein.

The database 196 may include data and supporting data structures that store and organize the data. In particular, the database 196 may be arranged with any database organization or structure including, but not limited to, a relational database, a hierarchical database, a network database, or combinations thereof. A database management system in the form of a computer software application executing as instructions on the processor 185 may be used to access the information or data stored in records of the database 196 in response to a query, where a query may be dynamically determined and executed by the operating system 194, other applications 195, or one or more modules.

While the forms of apparatus and methods herein described constitute preferred examples of this invention, it is to be understood that the invention is not limited to these precise forms of apparatus and methods, and the changes may be made therein without departing from the scope of the invention.

What is claimed is:

1. A compact test range system for testing an article located within a test zone, the compact test range system comprising:
    a reflector defining a surface and a focus;
    a feed horn configured to emit a radio wave including an infinite number of rays, wherein the rays of the radio wave include an uppermost ray, a middle ray, and a lowermost ray directed towards the surface of the reflector;
    one or more processors; and
    a memory coupled to the one or more processors, the memory storing data comprising a database and program code that, when executed by the one or more processors, causes the compact range test system to:
    receive as input a plurality of field tilt angles;
    in response to receiving the plurality of field tilt angles, determine three points of intersection between the uppermost ray, the middle ray, and the lowermost ray at a first field tilt angle, wherein the three points of intersection define a triangle;
    determine a centroid of the triangle; and
    set the centroid of the triangle as a first test position of the feed horn, wherein the first test position is offset in an x-direction and a y-direction from the focus of the reflector, and the first field tilt angle corresponds to the first test position.

2. The compact test range system of claim 1, wherein the uppermost ray, the middle ray, and the lowermost ray reflect off of the surface of the reflector to create a flat phase front within the test zone.

3. The compact test range system of claim 1, wherein the first field tilt angle is measured between a y-axis of the compact test range system and an imaginary line, and wherein the imaginary line is normal to the rays of the radio wave.

4. The compact test range system of claim 1, wherein the plurality of field tilt angles are based on a specific type of testing to be performed by the compact test range system.

5. The compact test range system of claim 1, comprising an actuator in communication with the one or more processors, and wherein the compact test range system further comprises a feed path rail.

6. The compact test range system of claim 5, wherein the one or more processors determine a plurality of test positions that are each offset from the focus of the reflector, and wherein the feed horn is steered into the plurality of test positions along the feed path rail by the actuator.

7. The compact test range system of claim 1, comprising a plurality of feed horns each in communication with the one or more processors, wherein the plurality of feed horns are each positioned at a unique location that is offset in both the x-direction and the y-direction from the focus of the reflector.

8. The compact test range system of claim 7, wherein the plurality of feed horns are activated one at a time by the one or more processors.

9. The compact test range system of claim 7, wherein the plurality of feed horns are each activated one by one for a period of time, wherein the period of time is enough for activation of the plurality of feed horns to appear instantaneous to an ordinary observer.

10. The compact test range system of claim 1, wherein the feed horn is either a low gain feed horn or a high gain feed horn.

11. The compact test range system of claim 1, wherein the compact test range system is a prime-focus compact range testing system.

12. A method for testing an article within a test zone by a compact test range system, the method comprising:
    receiving, by a computer, a plurality of field tilt angles, wherein the computer is in communication with a feed horn;
    emitting, by the feed horn, a radio wave including an infinite number of rays, wherein the rays of the radio wave include an uppermost ray, a middle ray, and a lowermost ray towards a surface of a reflector;
    in response to receiving the plurality of field tilt angles, determining three points of intersection between the uppermost ray, the middle ray, and the lowermost ray of a first field tilt angle by the computer, wherein the three points of intersection define a triangle;
    determining, by the computer, a centroid of the triangle; and
    setting the centroid of the triangle as a first test position of the feed horn, wherein the first test position is offset in an x-direction and a y-direction from a focus of the reflector, and the first field tilt angle corresponds to the first test position.

13. The method of claim 12, comprising reflecting the uppermost ray, the middle ray, and the lowermost ray reflect off of the surface of the reflector to create a flat phase front within the test zone.

14. The method of claim 12, comprising measuring the first field tilt angle between a y-axis of the compact test range system and an imaginary line, and wherein the imaginary line is normal to the rays of the radio wave.

15. The method claim 12, wherein the plurality of field tilt angles are based on a specific type of testing to be performed by the compact test range system.

16. The method of claim 12, comprising placing an actuator in communication with the computer, wherein the compact test range system further comprises a feed path rail.

17. The method of claim 16, comprising determining a plurality of test positions that are each offset from the focus of the reflector by the computer.

18. The method of claim 17, comprising steering the feed horn into the plurality of test positions along the feed path rail by the actuator.

19. The method of claim 12, comprising placing a plurality of feed horns in communication with the computer, wherein the plurality of feed horns are each positioned at a unique location offset in both the x-direction and the y-direction from the focus of the reflector.

20. The method of claim 19, comprising activating each of the plurality of feed horns one at a time by the computer.

* * * * *